United States Patent
Flammenspeck et al.

(10) Patent No.: US 8,874,414 B2
(45) Date of Patent: Oct. 28, 2014

(54) MODEL POPULATION

(75) Inventors: Wolfgang Flammenspeck, Alberta (CA); Lorne Jensen, Calgary (CA)

(73) Assignee: Fluor Technologies Corporation, Aliso Viejo, CA (US)

(*) Notice: Subject to any disclaimer, the term of this patent is extended or adjusted under 35 U.S.C. 154(b) by 317 days.

(21) Appl. No.: 13/301,608

(22) Filed: Nov. 21, 2011

(65) Prior Publication Data

US 2013/0132039 A1     May 23, 2013

(51) Int. Cl.
*G06F 17/50*     (2006.01)

(52) U.S. Cl.
CPC .................... *G06F 17/5004* (2013.01)
USPC ............ 703/2; 703/7; 706/13; 382/111

(58) Field of Classification Search
CPC ........................................... G06F 17/5004
USPC ................... 703/2, 7; 706/13; 382/111
See application file for complete search history.

(56) References Cited

U.S. PATENT DOCUMENTS

| | | | |
|---|---|---|---|
| 6,944,513 B1 | 9/2005 | Tomomitsu et al. | |
| 7,571,084 B2 | 8/2009 | Smith et al. | |
| 7,730,002 B2 * | 6/2010 | Afeyan et al. | 706/13 |
| 2005/0261953 A1 * | 11/2005 | Malek et al. | 705/10 |
| 2006/0038812 A1 | 2/2006 | Warn et al. | |
| 2006/0080268 A1 * | 4/2006 | Afeyan et al. | 706/13 |
| 2007/0282666 A1 * | 12/2007 | Afeyan et al. | 705/10 |
| 2010/0111370 A1 * | 5/2010 | Black et al. | 382/111 |
| 2010/0223032 A1 | 9/2010 | Reghetti et al. | |

OTHER PUBLICATIONS

"Steel Detailing Services", AceCad Software, 2011, http://www.acecadsoftware.com/stell_detailing_services, last visted May 19, 2011.
"Steel Detailing", Pinnacle, 2007, http://www.pinnaclecad.com/steel-detailing.html, last visited May 19, 2011.
"SmartPlant(R) Foundation", Intergraph Corporation, 2010, http://www.intergraph.com/prodcuts/ppm/smartplan/foundation/defaul.aspx, last visited Feb. 20, 2012.
Patent Cooperation Treaty, "Notification of Transmittal of the International Search Report and the Written Opinion of the International Searching Authority, or the Declaration", PCT Application No. PCT/12/66052, issued Feb. 5, 2013.

\* cited by examiner

*Primary Examiner* — Thai Phan
(74) *Attorney, Agent, or Firm* — Fish & Tsang, LLP

(57) ABSTRACT

Systems and methods for populating a design model for engineering, design, and construction projects are described. The design model contains a 3D representation of an assembled structure. Each structural component within the assembled structure has a set of physical attributes that are electronically stored as design model objects. Additional information about each structural component is electronically supplied by a detailer as detailing model objects. The detailing model objects are imported into the design model using a utility tool. The utility tool comprises a processor and executable code that is configured to: (i) correlate the design and detailing model objects; and (ii) recommend to a user which detailing objects should be imported into the design model. The utility tool correlates physical attributes (e.g., location, section size, section type) rather than unique identification numbers, thus allowing the design model to be populated without relying on identification numbers.

16 Claims, 5 Drawing Sheets

Update Summary 700

System 800

MODEL POPULATION

FIELD OF THE INVENTION

The field of the invention is design model population for engineering, design, and construction (EDC) projects.

BACKGROUND

Three dimensional (3D) computer aided design (CAD) modeling is commonly used to plan construction projects. Design engineers, hereinafter referred to as "designers," use design modeling software to construct a virtual building by assembling numerous structural components (e.g., trusses, steel beams, etc) in a mathematical design space. Modeling software provides a visual preview of an erected structure and allows engineers to determine appropriate dimensions for accurate assembly. The software also reduces human error and helps engineers calculate loading stresses and select appropriate material grades for each structural component. Modeling has been extremely valuable in planning complex construction projects that involve thousands of interconnecting parts.

Once the designer has modeled a structure, the designer sends the design model to a "detailer," who is responsible for providing additional information about each structural component in the design model (e.g., connection information, material grades, piece marks). The detailer provides this additional information in a "detailing model file." One of the problems with current design model software is that it can be very time consuming to manually import the data from the detailing model into the design model. This is due, in part, to the fact that designers and detailers use different software programs and file formats to create and store design models and detailing models.

Some commercial design model software, such as Smart-Plant 3D™ by Intergraph Corp. (see http://www.intergraph.com), have addressed this problem by providing an import tool that allows the designer to import data from the detailing model into the design model. However, the import tool requires three conditions in order to function properly: (1) the detailing model must have been originally created by importing the structural component data from the design model; (2) the detailer cannot delete, move, or add structural members in the detailing model; (3) the designer and detailer must maintain unique ID numbers for each structural member in the design/detailing models. This can be very problematic since design specifications often change throughout the engineering, design, and construction phases, which can lead to modifications and/or additions to the unique ID number. Thus, numerous disadvantages remain in current methods and systems for populating design models with data from detailing models.

It has yet to be appreciated that a design space can be populated by correlating physical attributes rather than unique identification numbers.

U.S. Pat. No. 7,571,084 to Smith discloses methods and systems for creating new car designs. Specifically, Smith discloses populating a mathematical design space (e.g., a computer aided design drawing) by selecting exemplar designs from a catalog and morphing the exemplars together to form a new design. The exemplars are morphed together using a software application that matches physical features of each of the exemplar designs and performs a weighted linear combination of the features. The resulting morph is loaded into the design space, allowing a designer to make additional modifications to the new design based on specific design constraints. However, Smith fails to disclose populating an already existing design space with additional information by correlating physical attributes in the design space with physical attributes in the exemplars.

These and all other extrinsic materials discussed herein are incorporated by reference in their entirety. Where a definition or use of a term in an incorporated reference is inconsistent or contrary to the definition of that term provided herein, the definition of that term provided herein applies and the definition of that term in the reference does not apply.

Thus, there is still a need for improved methods and systems for populating design models.

SUMMARY OF THE INVENTION

The inventive subject matter provides apparatus, systems, and methods in which one can populate a design space without using a unique identification number for each structural component. Contemplated systems comprise a storage medium, a processor, and executable code, all communicatively coupled together. The storage medium contains a plurality of design model objects and a plurality of detailing model objects. The detailing model objects and design model objects represent real-life physical attributes of a structural component (e.g., trusses, steel beams, etc). The executable code is configured to populate the design model with additional information by correlating detailing model objects with design model objects.

As used herein, the term "populate" means to import or otherwise input information into a design space. As used herein, the term "design space" refers to an electronic medium suitable for storing a mathematical representation of a structure. The design space can be 2-dimensional or 3-dimensional and preferably includes two or more related structural components. The design space is preferably displayed to a user via an interface. As used herein, the term "physical attribute" refers to data that describes a physical characteristic of a structural component. For example, material grade, section shape, section size, location information within a 3D environment, and connection types are all considered physical attributes of a structural component. In contrast, a unique identification number is not a physical attribute since it does not describe a physical characteristic of a structural member.

In one aspect of some preferred embodiments, design model objects and detailing model objects are stored in a proprietary format that is only readable using commercial software. For example, design model objects could be stored in SmartPlant3D™ format.

The physical attributes represented by the detailing model objects can include length, volume, shape, section size, location, material grade, connection type, project phase (e.g., engineering, design, construction), and vendor. However, this list is not exclusive and can include any number of attributes relevant to engineering, design, and construction projects.

In another aspect of some preferred embodiments, contemplated systems include a display and an input device for allowing a user to select subsets of the detailing and design objects. More preferably, the system includes multiple displays and input devices, thus allowing multiple users to simultaneously select subsets of the detailing and design objects. In this manner, multiple users can simultaneously populate various portions of the same design space.

In yet another aspect of some preferred embodiments, the executable code is configured to display an "import utility window" on the display. The utility window provides an interface for allowing a user to: (1) select a subset of the detailing and design objects (e.g., source files); (2) run a correlation of the detailing objects with design objects; and (3) decide how to populate the design space based on the correlations.

From a methods perspective, the inventive subject matter provides a method of populating a design space by providing a user with a computing device and interface, and allowing the user to (1) select a subset of design model objects and detailing model objects via the interface, (2) run a correlation of the objects using executable code on the computing device, and (3) populate the design space based on the computed correlations.

Various objects, features, aspects and advantages of the inventive subject matter will become more apparent from the following detailed description of preferred embodiments, along with the accompanying drawing figures in which like numerals represent like components.

DETAILED DESCRIPTION

It should be noted that while the following description is drawn to a computer/server based work package processing system, various alternative configurations are also deemed suitable and may employ various computing devices including servers, interfaces, systems, databases, agents, peers, engines, controllers, modules, utilities, or other types of computing devices operating individually or collectively. One should appreciate the computing devices comprise a processor configured to execute software instructions stored on a tangible, non-transitory computer readable storage medium (e.g., hard drive, solid state drive, RAM, flash, ROM, etc.). The software instructions preferably configure the computing device to provide the roles, responsibilities, or other functionality as discussed below with respect to the disclosed apparatus. In especially preferred embodiments, the various servers, systems, databases, or interfaces exchange data using standardized protocols or algorithms, possibly based on HTTP, HTTPS, AES, public-private key exchanges, web service APIs, known financial transaction protocols, or other electronic information exchanging methods. Data exchanges preferably are conducted over a packet-switched network, the Internet, LAN, WAN, VPN, or other type of packet switched network.

One should appreciate that the disclosed techniques provide many advantageous technical effects including the ability to quickly mass populate a design model after modifying and/or adding structural components to the design space, irrespective of the format of the imported data.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

Figure 1:
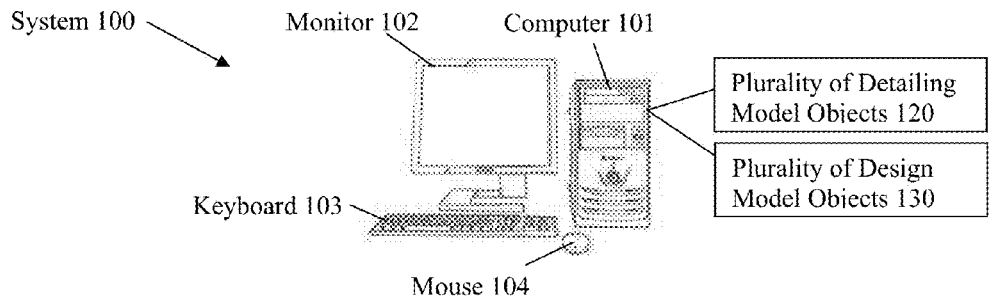
FIG. 1 is a schematic of one preferred embodiment of a system for populating a design space.

FIG. 1 shows a system 100, which can be used to populate a design space. System 100 includes a computer 101, display monitor 102, keyboard 103, and mouse 104. Computer 101 comprises a storage medium, processor, and executable code. Storage mediums, processors, and methods of implementing software code are well known. One of skill in the art will appreciate that many different hardware configurations can be used consistently with the inventive subject matter. For example, storage medium within computer 101 could comprise multiple hard drives communicatively coupled together. Likewise, the processor could comprise a single core processor, dual core, or any other processor configuration suitable for processing data and executing software code.

The storage medium within computer 101 stores a plurality of detailing model objects 120 and a plurality of design model objects 130. Objects 120 and 130 represent physical attributes of at least one structural component (e.g., a steel beam or truss). Examples of physical attributes include length, volume, section size, section type (e.g., beam, column, brace, etc), location (i.e., spatial coordinates), material grade, material property (e.g., flexural strength, hardness, conductivity, thermal expansion), shape (e.g., H, I, W beams), connection type, and component vendor. Objects 120 and 130 can be stored in subsets, wherein the objects within each subset are associated with one structural component. Alternatively, objects 120 and 130 can be stored together in one location (e.g., file or folder). One of skill in the art will appreciate that numerous file/folder structures, hierarchies and organizations can be used consistently with the inventive subject matter disclosed herein.

Figure 3:
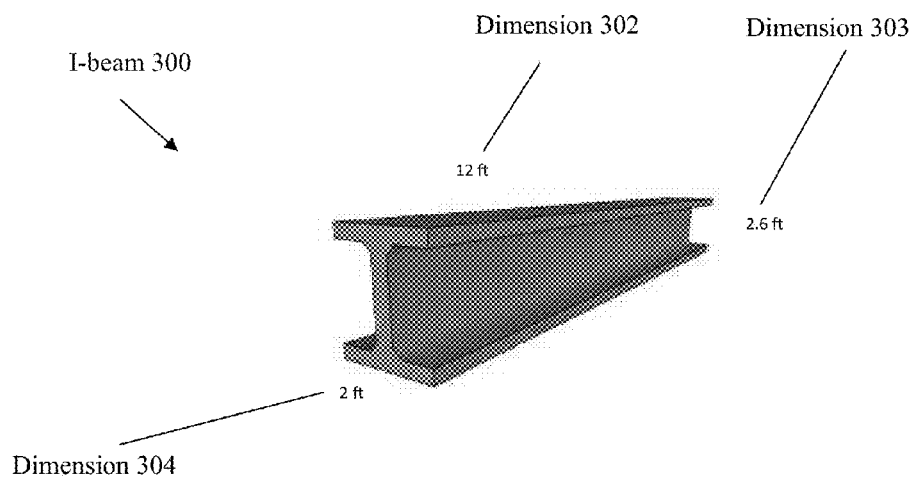
FIG. 3 is a perspective view of a structural component.

The executable code stored within computer 101 is configured to correlate detailing objects 120 with design objects 130. As used herein, "correlate" means to associate data objects based on a relationship between the data objects. For example, the executable code could be configured to display all detailing objects that exactly match a selected design object. The executable code could also be configured to display an ordered list of detailing objects from closest-match to least-closest-match for a given design object. Furthermore, the executable code could be configured to correlate subsets of design objects with subsets of detailing objects. For example, where a subset of design objects describes one specific structural component (or category of repeating components) in an assembled structure, the executable code can correlate the subset to all existing subsets of detailing objects that are related (in kind) to the structural component. In other words, the executable code can be configured to search through a database of detailing model files, and determine which model file (or detailing model object sets) best matches a particular subset of design objects. Preferably, the user can control how each design object is weighted with respect to other design objects in order to determine best subset matches. As used herein, "detailing model file" means a subset of detailing model objects that describes physical attributes of one structural component. An example of a structural component is shown in FIG. 3.

The executable code in computer 101 is also configured to display a list of all detailing and design objects, and allow a user to select subsets of each before performing a correlation. The user can make a subset selection using keyboard 103, mouse 104, and a utility window (see FIG. 6) displayed on monitor 102. Once a correlation has been performed, the executable code is configured to display the correlations to a user via the utility window on monitor 102. A user can then select which detailing objects should be used to populate a design space. The particular rules for correlating and displaying correlations is preferably user-defined and can be customized according to each EDC project's specific requirements.

Figure 2:
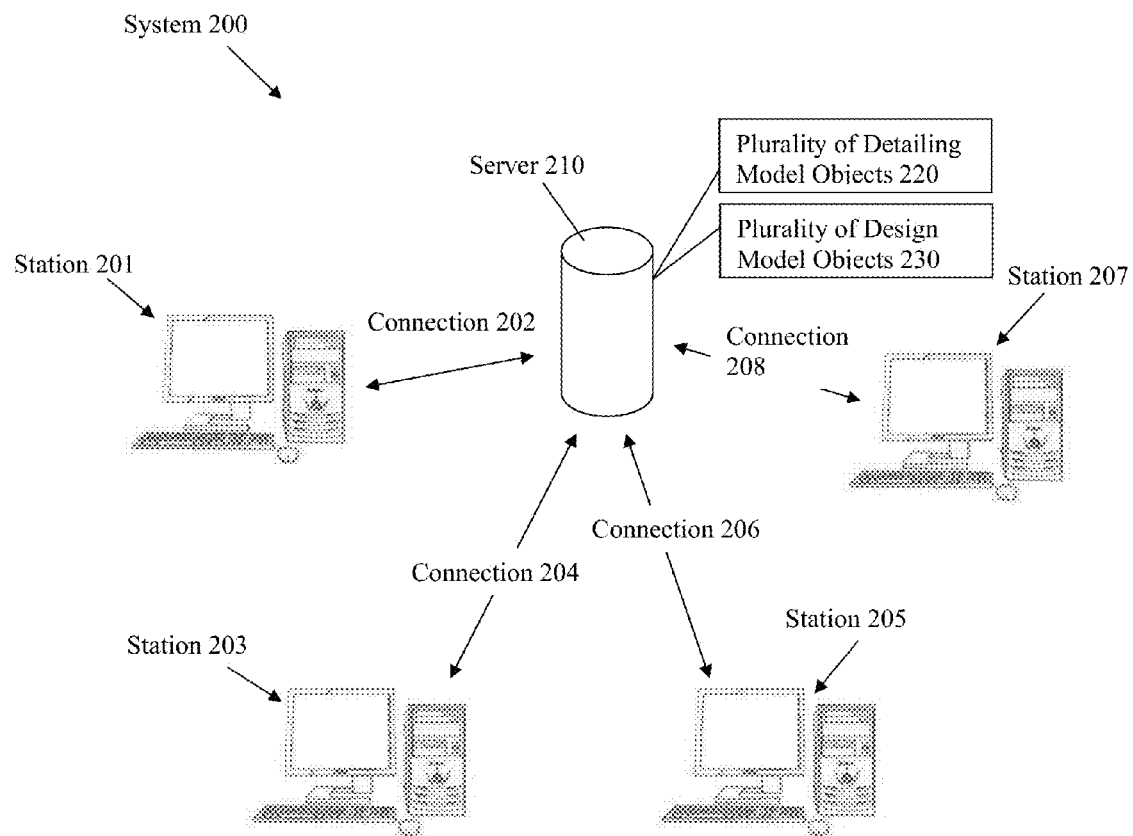
FIG. 2 is a schematic of another preferred embodiment of a system for populating a design space.

FIG. 2 shows system 200, which can be used to populate a design space. System 200 has four stations: station 201, 203, 205, and 207. Each station includes hardware similar to system 100. Each station is communicatively couple to one another via connections 202, 204, 206, 208 and server 210. Connections 202, 204, 206, and 208 could comprise a wide area network (either private or public, e.g. the internet), a local area network, a wireless connection, Ethernet cable connection, fiber optics connection, or any other configuration suitable for electronic communication. One of skill in the art will appreciate that the exact number of stations within system 200 can vary depending on the size of the (EDC) project and number of users. Any number of stations can be used consistently with the inventive subject matter. Furthermore, one of skill in the art will also appreciate that stations can connect to server 210 indirectly (e.g., via another station).

Server 210 includes a storage medium for storing and managing a plurality of detailing model objects 220 and a plurality of design model objects 230. Server 210 also preferably includes a processor and executable code. However, those of skill in the art will appreciate that numerous variations in the distribution of processing and storage can be used consistently with the inventive subject matter. For example, server 210 could comprise a virtual server, meaning the storage mediums of each of the stations, or portions thereof, are dedicated to act as a central network storage location for storing objects 220 and 230. A virtual server could also include processing tasks distributed amongst the processors in stations 201, 203, 205, and 207. In addition, one or more the stations could host the executable code and correlate objects 220 and 230.

FIG. 3 shows one example of a structural component, I-beam 300, which can be used in an assembled structure. I-beam 300 has numerous physical attributes, such as dimensions 302, 303, and 304. I-beam 300 could have many more physical attributes, such as material grade, section type (e.g., beam), section shape (e.g., "I"), weight, strength, etc. All physical attributes that are relevant to an engineering, design, and construction project can be stored as design/detailing model objects in an electronic format within the storage mediums of systems 100 and 200 as detailing model objects. The objects can be stored either in a proprietary format or in a neutral/standard format.

Figure 4:
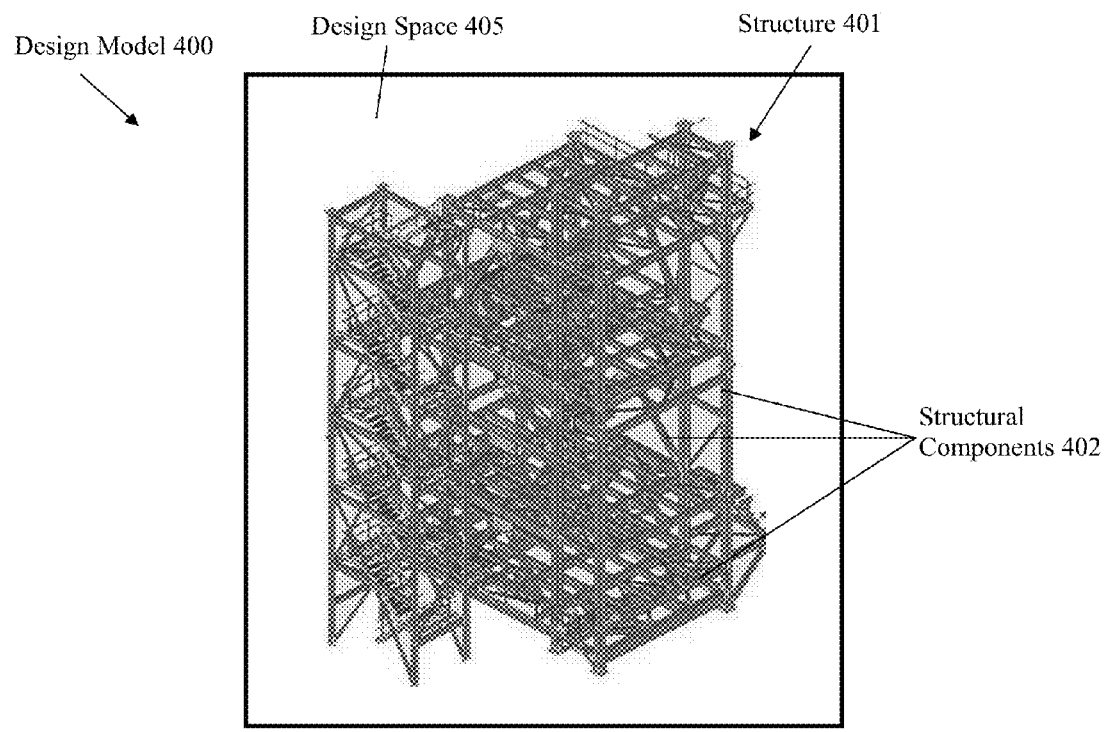
FIG. 4 is a schematic of a design model comprising many structural components.

FIG. 4 shows a design model 400. Model 400 has a design space 405. Within design space 405 is a partially populated 3D structure 401. Structure 401 is an assembly of numerous structural components 402. Design model 400 has been populated with structural components 402 using system 100 and/or system 200. Each structural component within design space 405 has a set of physical attributes that are electronically stored as design model objects. The structural components have been created and/or uploaded into design space 405 by a designer.

Figure 5:
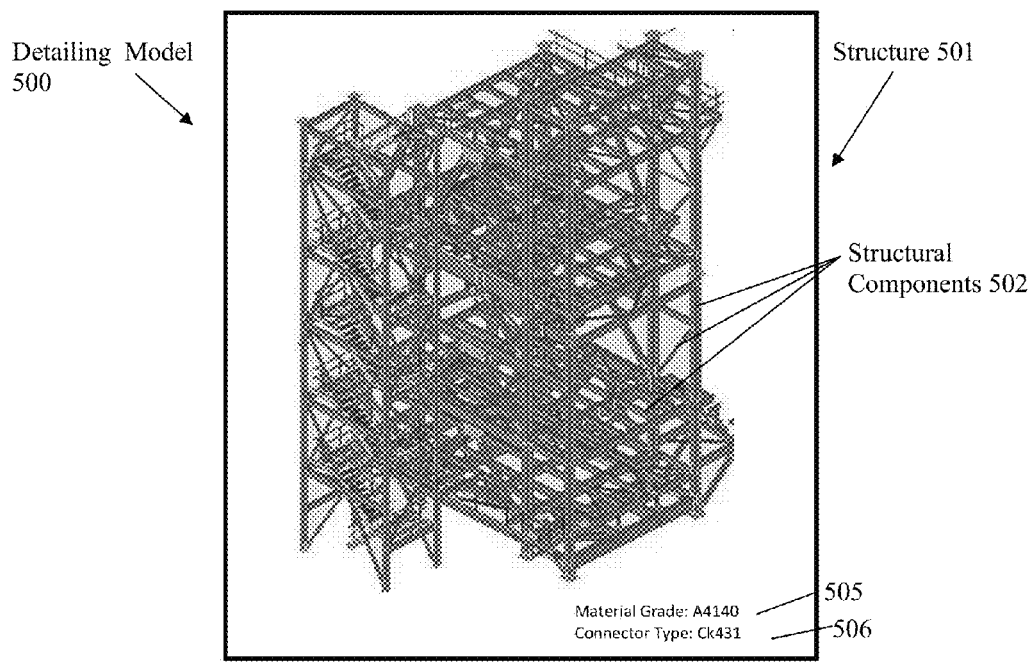
FIG. 5 is a schematic of a detailing model.

FIG. 5 shows a detailing model 500. Model 500 is similar to model 400 except that a detailer has added additional information to structural components 502. The additional information includes material grade 505, connector types 506, and other information relevant to assembling structural components 402. The additional information is stored as detailing model objects within the electronic storage medium of computer 101 and/or server 210. A utility tool within systems 100 and 200 is configured to correlate detailing objects from detailing model 500 to design objects from design model 400 and present matches, or close matches, of detailing and design objects. A designer can use the utility tool to decide when and how to automate a population of design model 400 with the information added to detailing model 500 by a detailer.

Figure 6:
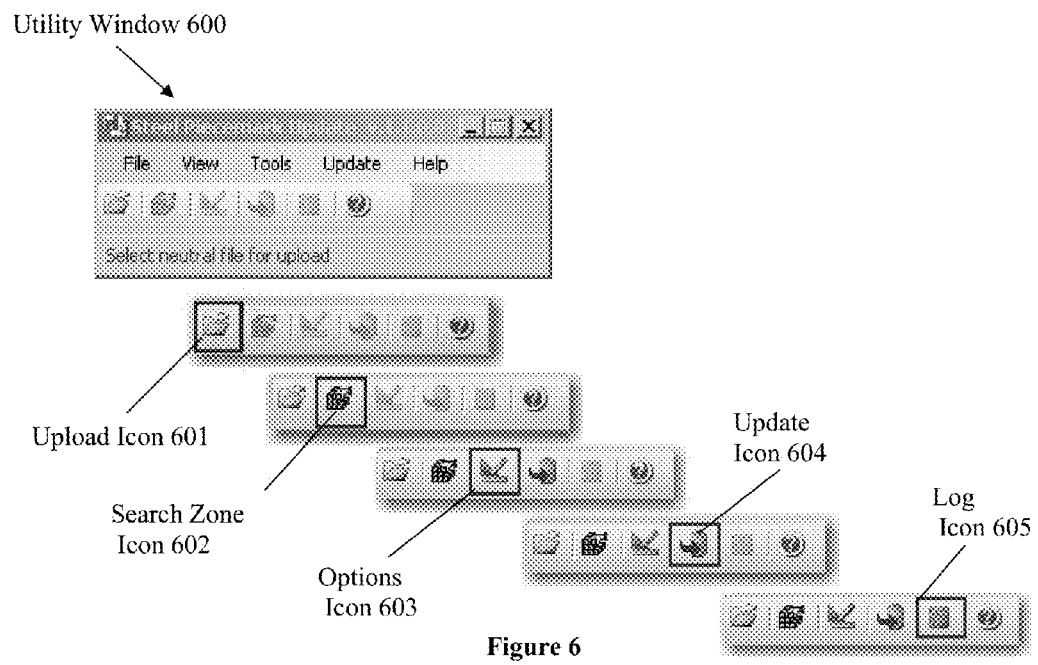
FIG. 6 is a schematic of an import utility window.

FIG. 6 shows an importing utility window 600 for allowing a user to control an import utility tool. The import utility tool is useful for importing detailing model file data into a design model file. Window 600 has an upload icon 601 for allowing a user to select and upload subsets of detailing model objects (e.g., files containing detailing model objects). In some preferred embodiments, the user can upload a Steel Detailing Neutral Format file. However, other format file formats could also be used in accordance with the inventive subject matter (e.g., CIMsteel Integration Standards version 2.0 Format).

Search Zone Icon 602 allows a user to define a "search zone," which is a 3-dimensional area within the uploaded file defined by xyz coordinates. The search zone provides a limited area in which the import utility tool will look to correlate detailing model objects with design model objects. However, it is contemplated that the search zone could be defined as the entire uploaded file.

Options icon 603 allows a user to access and configure preferences and options for the upload utility tool. For example, option Icon 603 provides the user with an ability to limit correlations based on categories of structural components (e.g., beams, brace, column).

Figure 7:
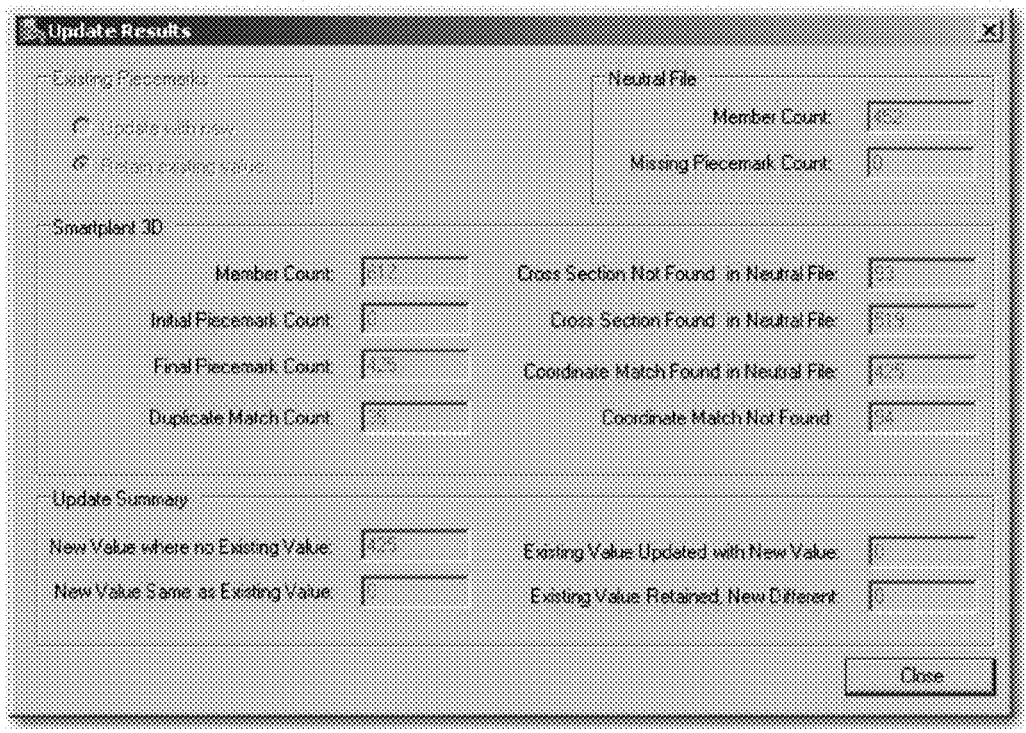
FIG. 7 is a schematic of an update summary window.

Update icon 604 allows the user to run a correlation of detailing objects with design objects. At the completion of the correlation, an update summary is displayed. FIG. 7 shows an example update summary 700. Summary 700 provides the user with recommendations on how the design model file should be updated with detailing objects. The user may choose to redefine the search zone and/or options, and run the update again in an iterative process before deciding how to update the design model file.

Log Icon 605 allows the user to view a log of update summaries. Window 600 also includes a help icon for providing the user with help and instruction.

In one embodiment utility window 600 is developed as a Microsoft.NET assembly (dll) using Microsoft.Net Framework 3.51 and using development language VB.NET. However, other assemblies, development applications, and languages can be used consistently with the inventive subject matter.

Utility window 600 is configured to provide the user with a preview of a population. The user can review a population and make changes before finally importing new data into a design model file. For example, when a correlation summary finds that a structural member already occupies a particular location within the design space (i.e., the design space contains conflicting information), window 600 provides the user with the options of either: (1) retaining the existing structural component and/or data object; or (2) update/replace the existing component or data object. All correlations and decisions are logged in a history for tracking and viewing changes.

Figure 8:
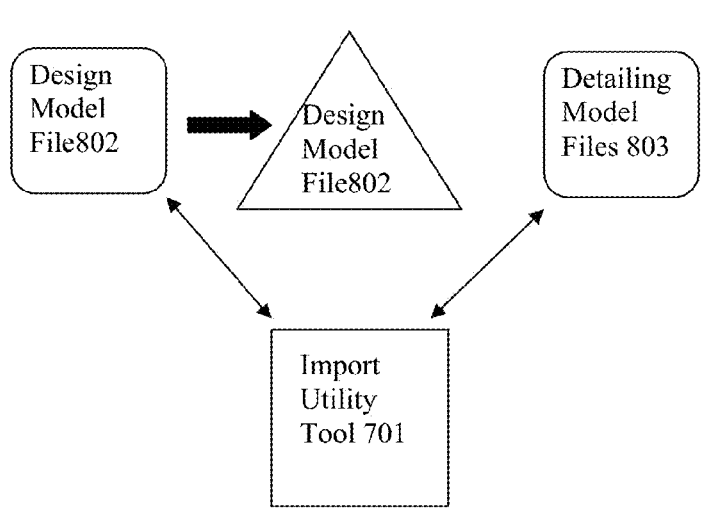
FIG. 8 is a schematic of one embodiment of an import tool for importing detailing model data into a design model file.
Figure 9:
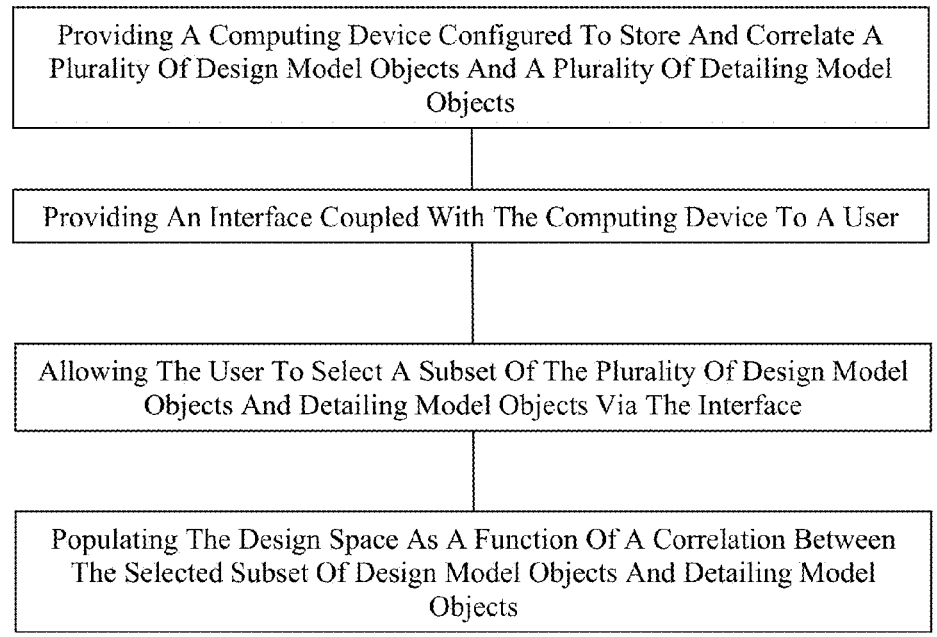
FIG. 9 is a schematic of a method for populating a design space.

FIG. 8 shows a schematic of a system 800, which includes an import utility tool 801 communicatively coupled with a design model file 802 and a detailing model file 803. Utility 801 receives data objects from files 802 and 803. Utility 801 then compares the data to determine best matches. The data used to determine best matches preferably includes data regarding location, section type, and section size of a structural component. Once utility 801 has identified correlations, utility 801 recommends a new set of data objects from file 803 that should be imported into 802 and associated with a structural component represented by data objects in file 802. Utility 801 allows a user to control how correlations are run, as well as when/how data is imported into file 802. Once file 802 has received additional data from detailing model file 803, file re-saved as file 804.

FIG. 8 shows a method 800 for populating a design space without relying on unique identification numbers of structural components within a design model. The method includes the steps of: (1) providing a computing device to a user, wherein the device is configured to store and correlate a plurality of design model objects and a plurality of detailing model objects; (2) providing the user with an interface coupled with a computing device; (3) allowing the user to select a subset of the plurality of design model objects and detailing model objects via the interface; and (4) populating the design space as a function of a correlation between the selected subset of design model objects and detailing model objects. The interface preferably displays a utility window configured to allow a user to perform the functions of selecting detailing and design objects (e.g., source files) and populating the design space.

While contemplated systems and methods do not rely on unique identification numbers, one of skill in the art will appreciate that identification numbers can nonetheless continue to be included in design models to facilitate identification. Furthermore, identification numbers can be stored as detailing and design model objects, and used in conjunction with correlation operations discussed above. For example, the executable code could be configured to match detailing and design model objects that represent unique identification numbers, and then correlate other detailing and design objects within the same subsets to identify and resolve conflicts (i.e., the ID numbers match but not all the physical attributes of the structural components match). In addition, contemplated systems and methods could additionally provide the user with the ability to automatically update and/or correct identification numbers based on the correlations.

Unless the context dictates the contrary, all ranges set forth herein should be interpreted as being inclusive of their endpoints and open-ended ranges should be interpreted to include commercially practical values. Similarly, all lists of values should be considered as inclusive of intermediate values unless the context indicates the contrary.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

It should be apparent to those skilled in the art that many more modifications besides those already described are possible without departing from the inventive concepts herein. The inventive subject matter, therefore, is not to be restricted except in the scope of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A system for populating a design space for an engineering, design, and construction (EDC) project, comprising:
    a storage medium storing a plurality of design model objects and detailing model objects;
    wherein the plurality of design model objects are defined by a designer and represent physical attributes of at least one structural component;
    wherein the plurality of detailer model objects are defined by a detailer and represent additional physical attributes of the at least one structural component;
    a processor communicatively coupled to the storage medium; and
    executable code configured to:
        correlate the detailing model objects with the design model objects using one or more physical attributes of the at least one structural component;
        present a correlation of detailing model design modeling objects to the designer; and
        populate the design space based on an automation decision of the designer.

2. The system of claim 1, wherein the plurality of design model objects are stored in a proprietary format that is distinct from a proprietary format used to store the detailing model objects.

3. The system of claim 1, wherein one or more of the physical attributes is selected from the group consisting of length, volume, section size, section type, location, material grade, shape, connection type, and component vendor.

4. The system of claim 1, wherein the detailing model objects and design model objects that are used to correlate and to populate the design space are selected from the group consisting of location, section size, and section type.

5. The system of claim 1, wherein the structural component comprises a steel beam.

6. The system of claim 1, further comprising a display and an input device.

7. The system of claim 6, wherein the executable code is configured to display an import utility window on the display.

8. The system of claim 7, wherein the import utility window is configured to allow a user to select a source file containing at least a portion of the plurality of detailing model objects.

9. The system of claim 6, wherein the executable code is configured to simultaneously display a plurality of import utility windows on different displays for allowing simultaneous inputs from multiple users.

10. The system of claim 1, wherein the plurality of design model objects and detailing model objects further represent a construction project phase.

11. A method of populating a design space, comprising:
    providing a computing device configured to store and correlate a plurality of detailing model objects and a plurality of design model objects;
    wherein the plurality of design model objects are defined by a designer and represent physical attributes of at least one structural component;
    wherein the plurality of detailer model objects are defined by a detailer and represent additional physical attributes of the at least one structural component;
    providing an interface coupled with the computing device;
    correlating the detailing model objects with the deign model objects using one or more physical attributes of the at least one structural components;

allowing the designer to select a subset of the correlated design model objects and detailing model objects via the interface; and populating the design space as a function of the designer's selection.

12. The method of claim 11, wherein the physical attribute is selected from the group consisting of length, volume, section size, section type, location, material grade, shape, connection type, and component vendor.

13. The method of claim 11, wherein the plurality of design model objects and detailing model objects further represent a construction project phase.

14. The method of claim 11, wherein the interface comprises a display, keyboard, and mouse.

15. The method of claim 14, wherein the interface further comprises an import utility window displayed on the display.

16. The method of claim 14, further comprising the step of modifying detailing model objects that represent location coordinates in order to normalize the coordinates with a standard global coordinate system.

* * * * *